US010830859B2

(12) United States Patent
Boudreau, Jr. et al.

(10) Patent No.: US 10,830,859 B2
(45) Date of Patent: Nov. 10, 2020

(54) VALIDATING FUNDAMENTAL-ONLY ENERGY MEASUREMENT

(71) Applicant: Landis+Gyr Innovations, Inc., Alpharetta, GA (US)

(72) Inventors: Frank J. Boudreau, Jr., Otterbein, IN (US); Dave Stenberg, West Lafayette, IN (US)

(73) Assignee: Landis+Gyr Innovations, Inc., Alpharetta, GA (US)

( * ) Notice: Subject to any disclaimer, the term of this patent is extended or adjusted under 35 U.S.C. 154(b) by 35 days.

(21) Appl. No.: 16/361,836

(22) Filed: Mar. 22, 2019

(65) Prior Publication Data

US 2020/0300958 A1 Sep. 24, 2020

(51) Int. Cl.
*G01R 35/04* (2006.01)

(52) U.S. Cl.
CPC .................. *G01R 35/04* (2013.01)

(58) Field of Classification Search
CPC ...................................................... G01R 35/04
USPC ........................................................... 324/74
See application file for complete search history.

(56) References Cited

U.S. PATENT DOCUMENTS

| 5,212,441 | A | 5/1993 | McEachern et al. |
| 6,122,603 | A * | 9/2000 | Budike, Jr. ............ G01D 4/004 |
| | | | 702/182 |
| 8,527,105 | B1 * | 9/2013 | Choong ................. G01D 4/004 |
| | | | 700/291 |
| 9,654,054 | B1 | 5/2017 | Omoumi et al. |
| 10,324,117 | B2 * | 6/2019 | Monnerie ............. G01R 21/133 |
| 2012/0041696 | A1 * | 2/2012 | Sanderford, Jr. ...... G06Q 50/06 |
| | | | 702/62 |
| 2013/0215933 | A1 * | 8/2013 | Young ................... H04B 1/7075 |
| | | | 375/145 |
| 2014/0371935 | A1 | 12/2014 | Kamel et al. |

OTHER PUBLICATIONS

Filipski et al., "Evaluation of Reactive Power Meters in the Presence of High Harmonic Distortion", IEEE Transactions on Power Delivery, vol. 7, Issue 4, Oct. 1992, pp. 1793-1799.

(Continued)

*Primary Examiner* — Reena Aurora
(74) *Attorney, Agent, or Firm* — Kilpatrick Townsend & Stockton LLP

(57) ABSTRACT

Certain aspects and features include a system and method for validating fundamental-only power measurements. A meter testing application calculates an expected registration for a meter under test by comparing a fundamental demand indicating an amount of power expected to be delivered by the fundamental component to a known load with a wideband demand indicating an amount of power expected to be delivered by the wideband voltage to the known load. The application further measures, from the meter under test, a measured registration by applying the wideband voltage component and the known load to the meter under test, which is configured to measure power consumption from the fundamental component only. The application calculates based on the expected registration and the measured registration, an error for the meter. When the error is outside a tolerance, the application identifies the meter under test as non-compliant.

20 Claims, 4 Drawing Sheets

(56) References Cited

OTHER PUBLICATIONS

Girgis et al., "Testing the Performance of Three-Phase Induction Watt-Hour Meters in the Presence of Harmonic Distortion", IEEE Transactions on Industry Applications, vol. 26, Issue 4, Jul. 1990, pp. 689-695.
Girgis et al., "Testing the Performance of Three-Phase Induction Watt-Hour Meters Using Reproduced Harmonically Distorted Actual Recorded Waveforms", IEEE, Oct. 1989, pp. 1769-1775.
Lubkcman et al., "Automated Testing of Solid-State Watthour Meters in the Presence of Harmonic Distortion", Sep. 1992, pp. 345-351.
Makram et al., "A Harmonic Analysis of the Induction Watthour Meter's Registration Error", IEEE, vol. 7, No. 3, Jul. 1992, pp. 1080-1088.
PCT Patent Application No. PCT/US2020/023949, International Search Report and Written Opinion, Jul. 28, 2020, 14 pages.

\* cited by examiner

VALIDATING FUNDAMENTAL-ONLY ENERGY MEASUREMENT

TECHNICAL FIELD

This invention relates generally to resource distribution systems and more specifically to testing systems for metering devices configured to measure energy consumption derived from fundamental components of a wideband waveforms.

BACKGROUND

Power distribution systems deliver power to end user premises such as homes and businesses. Metering devices located at an end user premises measure power consumed by electrical loads in the premises such as air conditioners, televisions, lights, and the like. While alternating-current power distribution systems typically generate voltages at a fundamental frequency, e.g., 50 or 60 hertz, waveform harmonics (e.g., 100 hertz, 120 hertz, etc.) can also be present on a power line due to electric loads. Such harmonics cannot generally be used by end user equipment.

Hence, some newer metering approaches require the measurement of only the fundamental waveforms when calculating power consumption. In some cases, existing meters that measure all waveforms can cause over-billing or under-billing due to the measurement of any harmonic content, which cannot always be used by an electric load.

Metering devices are tested to ensure accurate power measurement. But existing testing environments for validating utility meters are designed for wideband energy measurements and therefore compare meters under test to a reference energy consumption based on a wideband measurement, leading to erroneous results when testing meters that are configured to operate in fundamental-only mode. Hence, a need exists to modify existing validation environments to be able to correctly test meters configured to test only fundamental frequencies.

SUMMARY

Certain aspects and features include a system and method for validating fundamental-only power measurements. In an example, a method selects, by a meter testing system, a wideband voltage waveform from a set of predefined voltage waveforms, and a wideband current waveform from a set of predefined current waveforms. The wideband voltage waveform includes a fundamental voltage component and a harmonic voltage component. The wideband current waveform includes a fundamental current component and a harmonic current component. The method accesses, by the meter testing system, a wideband demand indicating an amount of power expected to be delivered by the wideband voltage waveform and the wideband current waveform over a period of time. The method accesses, by the meter testing system, a fundamental demand indicating an amount of power expected to be delivered by the fundamental voltage component and the fundamental current component over the period of time. The method calculates, by the meter testing system, an expected registration for a meter under test by comparing the fundamental energy to the wideband energy during the test interval. The method further measures, from the meter under test, a measured registration by applying, at the meter testing system and to the meter under test, the wideband voltage waveform and the wideband current waveform. The meter under test can be configured to measure power consumption from the fundamental components only. The method further calculates, by the meter testing system, based on the expected registration and the measured registration, an error for the meter. When the error is outside a tolerance, the method identifies the meter under test as non-compliant.

In an aspect, accessing the wideband demand can include calculating by the meter testing system, an expected power consumption contribution of the fundamental voltage component and the fundamental current component. Accessing the wideband demand can include calculating by the meter testing system, an additional expected power consumption contribution for the harmonic voltage component and the harmonic current component. Accessing the wideband demand can include combining by the meter testing system, the expected power consumption contribution and the additional expected power consumption contribution into a power contribution. Accessing the wideband demand can include deriving the wideband demand from the combination of the expected power consumption contribution and the additional expected power consumption contribution.

In an aspect accessing the wideband demand includes calculating, by the meter testing system, an expected reactive power contribution of the fundamental voltage component and the fundamental current component. Accessing the wideband demand can include calculating, by the meter testing system, an additional expected reactive power contribution for the harmonic voltage component and the harmonic current component. Accessing the wideband demand can include combining, by the meter testing system, the expected reactive power contribution and the additional expected reactive power contribution into a reactive power contribution. Accessing the wideband demand can include deriving the wideband demand from the combination of the power contribution and the reactive power contribution.

In an aspect, accessing the fundamental demand includes calculating a power contribution of the fundamental voltage component and the fundamental current component.

In an aspect, the method further includes determining a maximum voltage offset, a maximum current offset, and a maximum phase offset for the wideband voltage waveform. The method can further include updating the error based on the maximum voltage offset, the maximum current offset, and the maximum phase offset.

In an aspect, the measured registration is indicated by a number of pulses per unit time.

In an aspect, accessing the wideband demand includes applying the wideband voltage waveform and a known load to a reference meter for the period of time and obtaining a measurement from the reference meter.

In an aspect, an electric meter system includes a precision voltage source, a precision current source, and a computing device including a processor and a memory. The computing device can be configured to select a wideband voltage waveform from a set of predefined voltage waveforms, the wideband voltage waveform including a fundamental voltage component and a harmonic voltage component. The computing device can be further configured to select a wideband current waveform from a set of predefined current waveforms, the wideband current waveform including a fundamental current component and a harmonic current component. The computing device can be further configured to access, from the memory, a wideband demand indicating an amount of power expected to be delivered by the wideband voltage waveform and the wideband current waveform over a period of time. The computing device can be further configured to access, from the memory, a fundamental demand indicating an amount of power expected to be delivered by the fundamental voltage component and the fundamental current component over the period of time. The computing device can be further configured to calculate, by the processor, an expected registration for a meter under test by comparing the fundamental demand to the wideband demand. The computing device can be further configured to measure a measured registration by causing the precision voltage source to apply the wideband voltage waveform to the meter under test and the precision current source to apply the wideband current waveform to the meter under test. The meter under test is configured to measure power consumption from the fundamental voltage component and the fundamental current component only. The computing device can be further configured to calculate, by the processor and based on the expected registration and the measured registration, an error for the meter. The computing device can be further configured to determine when the error is outside a tolerance and identify the meter under test as non-compliant.

In an aspect, accessing the wideband demand can include calculating an expected power consumption contribution of the fundamental voltage component and the fundamental current component. Accessing the wideband demand can include calculating an additional expected power consumption contribution for the harmonic voltage component and the harmonic current component. Accessing the wideband demand can include combining the expected power consumption contribution and the additional expected power consumption contribution into a power contribution. Accessing the wideband demand can include deriving the wideband demand from the combination of the expected power consumption contribution and the additional expected power consumption contribution.

In an aspect, accessing the wideband demand can include calculating an expected reactive power contribution of the fundamental voltage component and the fundamental current component. Accessing the wideband demand can include calculating an additional expected reactive power contribution for the harmonic voltage component and the harmonic current component. Accessing the wideband demand can include combining the expected reactive power contribution and the additional expected reactive power contribution into a reactive power contribution. Accessing the wideband demand can include deriving the wideband demand from the combination of the power contribution and the reactive power contribution.

In an aspect, the computing device can be further configured to determine a maximum voltage offset, a maximum current offset, and a maximum phase offset for the wideband voltage waveform, and update the error based on the maximum voltage offset, the maximum current offset, and the maximum phase offset.

In an aspect, accessing the wideband demand includes applying the wideband voltage waveform and a known load to a reference meter for the period of time and obtaining a measurement from the reference meter.

In an aspect, accessing the fundamental demand includes calculating a power contribution of the fundamental voltage component and the fundamental current component.

In an aspect, the computing device is further configured to determine a maximum voltage offset, a maximum current offset, and a maximum phase offset for the wideband voltage waveform. The computing device is further configured to update the error based on the maximum voltage offset, the maximum current offset, and the maximum phase offset.

In an aspect, a meter testing environment includes an electric meter configured to measure a power consumption from a fundamental component only, a precision voltage source, a precision current source, and a computing device including a processor and a memory. The computing device can be configured to select a wideband voltage waveform from a set of predefined voltage waveforms, the wideband voltage waveform including a fundamental voltage component and a harmonic voltage component. The computing device can be configured to select a wideband current waveform from a set of predefined current waveforms, the wideband current waveform including a fundamental current component and a harmonic current component. The computing device can be configured to access, from the memory, a wideband demand indicating an amount of power expected to be delivered by the wideband voltage waveform and the wideband current waveform over a period of time. The computing device can be configured to access, from the memory, a fundamental demand indicating an amount of power expected to be delivered by the fundamental voltage component and the fundamental current component over the period of time. The computing device can be configured to calculate, by the processor, an expected registration for a meter under test by comparing the fundamental demand to the wideband demand. The computing device can be configured to measure, at the electric meter, a measured registration by applying the wideband voltage waveform and the wideband current waveform to the meter. The computing device can be configured to calculate, by the processor and based on the expected registration and the measured registration, an error for the meter. The computing device can be configured to detect when the error is outside a tolerance and identifying the meter under test as non-compliant.

In an aspect, the meter testing environment further includes a reference meter. Accessing the wideband demand can include applying the wideband voltage waveform and a known load to the reference meter for the period of time and obtaining a measurement from the reference meter.

In an aspect, accessing the fundamental demand includes calculating a power contribution of the fundamental component.

In an aspect, the computing device is further configured to determine a maximum voltage offset, a maximum current offset, and a maximum phase offset for the wideband voltage waveform, and update the error based on the maximum voltage offset, the maximum current offset, and the maximum phase offset.

These illustrative examples are mentioned not to limit or define the disclosure, but to provide examples to aid understanding thereof. Additional examples and further description are provided in the Detailed Description.

BRIEF DESCRIPTION OF THE FIGURES

These and other features, aspects, and advantages of the present disclosure are better understood when the following Detailed Description is read with reference to the accompanying drawings, where.

DETAILED DESCRIPTION

Power delivered to end user premises contains fundamental waveforms and can also contain harmonic content. Aspects of the present disclosure relate to validating utility meters that are designed to measure power delivered by fundamental frequency voltage and/or current waveforms (e.g., 120 Hz, 240 Hz) in a testing environment configured to expect a result based on power delivered by wideband voltage and current waveforms.

The following non-limiting example is introduced for discussion purposes. A meter testing application executing on a computing device selects a precision wideband voltage from a set of predefined voltage waveforms and a current waveform from a set of predefined current waveforms. The waveforms include a variety of different harmonic frequency components at different phase angles relative to a fundamental frequency.

Continuing the example, the meter testing application accesses an expected wideband demand that indicates an amount of power to be delivered by the wideband voltage and current waveforms over a period of time (e.g., 1800 Watts). The testing application accesses an expected fundamental demand that indicates an amount of power to be delivered by the fundamental components of the wideband waveforms and a known wide band current over a period of time (e.g., 1815 Watts). The application computes an expected registration by comparing the fundamental demand to the wideband demand (e.g., 99.17%).

Continuing the example, the meter testing application tests a meter that is configured to measure power derived from only the fundamental components of the wideband voltage waveform and the wideband current waveform. In response, the meter outputs an actual registration, indicating the power that the meter actually measured, e.g., 99.8%. Based on the expected registration and the actual registration, the application calculates an error, e.g., 0.6%. Based on the error being outside a tolerance, the testing application identifies the meter as outside specifications.

Figure 1:
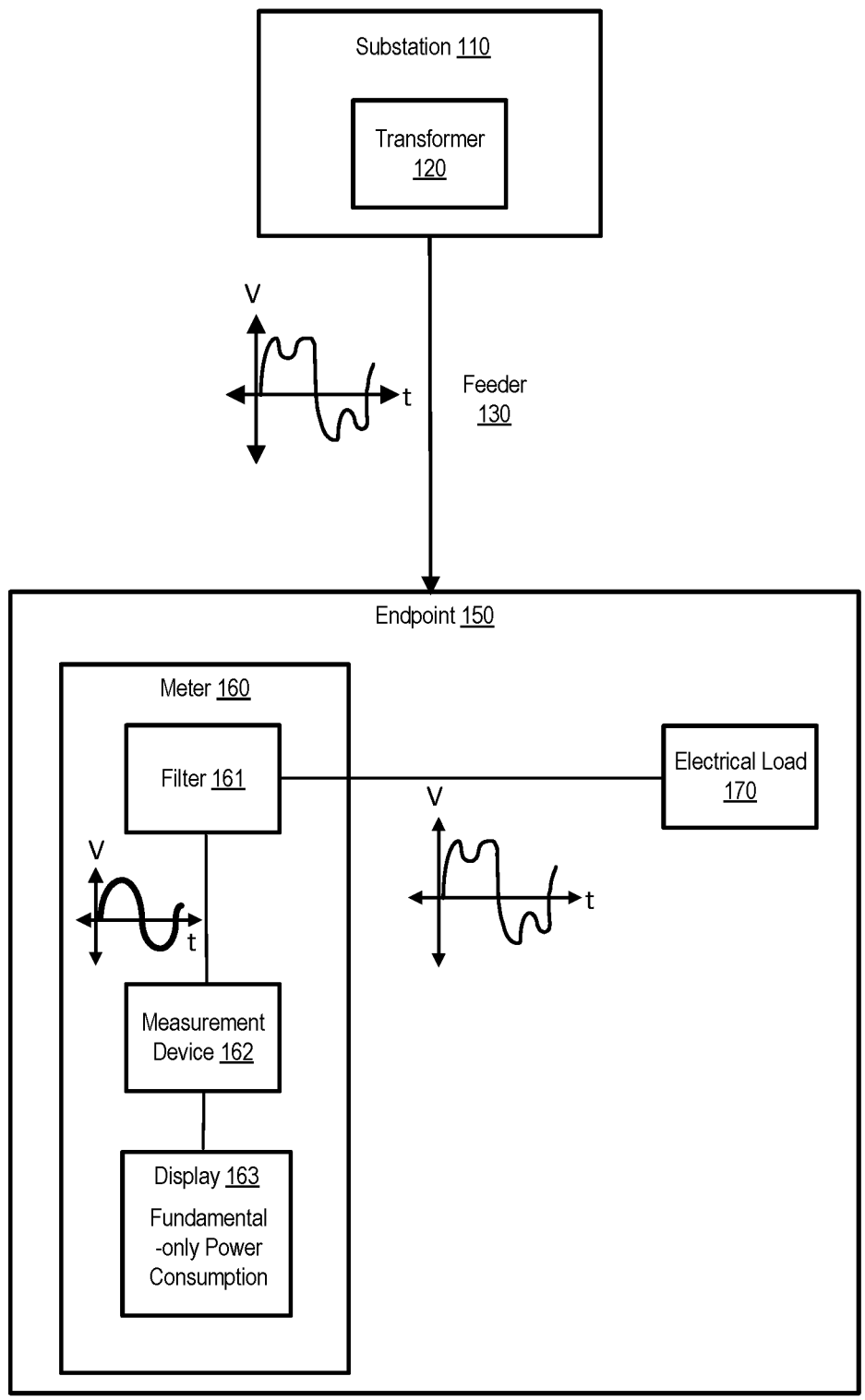
FIG. 1 illustrates an exemplary fundamental-only electric meter within a power distribution system.

Turning now to the figures, FIG. 1 illustrates an exemplary fundamental-only electric meter within a power distribution system. FIG. 1 depicts power distribution environment 100, which is an example of an environment in which a fundamental-only meter, or a meter that can be configured to measure power provided by a fundamental waveform only, can be deployed. Power distribution environment 100 includes one or more of substation 110, transformer 120, feeder 130, and endpoint 150. Substation 110 receives and distributes electric power, via transformer 120, to feeder 130. In turn, feeder 130 distributes power to endpoint 150.

Endpoint 150 and meter 160 are connected to electrical load 170 and are located on a premises. Examples of endpoint 150 are homes or businesses. Meter 160 can be configured to operate in wideband or fundamental-only mode. For example, in fundamental-only mode, meter 160 is configured measure a contribution of the fundamental component of the voltage on feeder 130 to a power consumption used by electrical load 170, thereby disregarding any power consumption contributions of any harmonic components that are present. Meters configured in fundamental-only mode can be required by local governments, for example, due to concerns about consumers being billed for harmonic power content. When meter 160 is configured in fundamental-mode, meter 160 can still be tested within an environment that can also test meters that measure wideband power consumption. An exemplary system is described in FIG. 2.

Examples of electrical load 170 include air conditioners, lights, and industrial equipment. For various reasons, such as non-linear electrical loads, the power delivered to endpoint 150 can include one or more harmonic frequencies. For example, as depicted, a supply voltage on feeder 130 could be 120 Volts at 60 Hz, but also include a third harmonic at 180 Hz. Additional harmonics are possible, e.g., a fifth harmonic at 300 Hz.

Meter 160 connects in series with feeder 130 such the current generated by applying the voltage from feeder 130 to electrical load 170 passes through meter 160. In fundamental-only mode, different means can be used to restrict measurement to fundamental-only components. One example of such a means is filter 161, which filters out the harmonic components from feeder 130, enabling measurement device 162 to measure only the fundamental component. Filter 161 can be a digital or an analog filter. Meter 160 can also include display 163, which can display information such as a current power consumption to a user.

Figure 2:
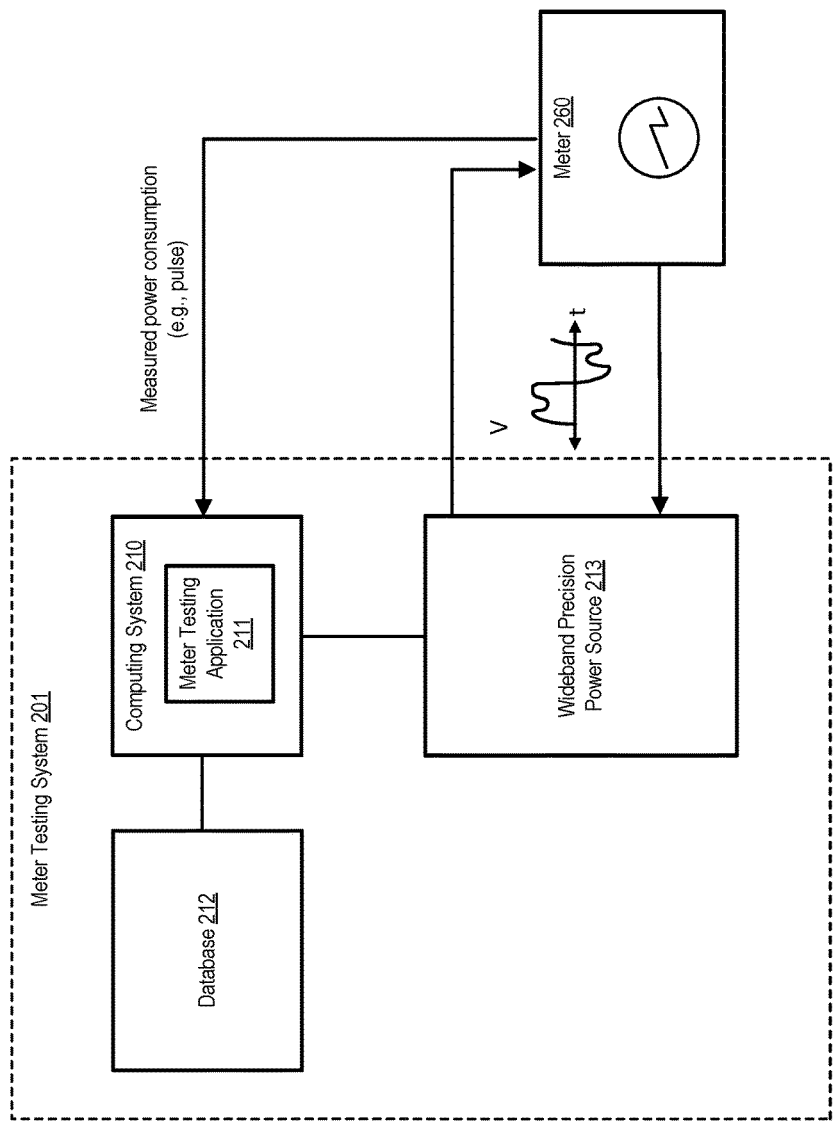
FIG. 2 illustrates an exemplary system for testing electric meters configured to measure power contributions from only fundamental waveforms.

FIG. 2 illustrates an exemplary system for testing electric meters configured to measure power contributions from only fundamental waveforms. FIG. 2 depicts testing environment 200, which includes meter testing system 201 and meter 260. Meter testing system 201 is configurable to test meter 260. Meter 260 can be configured to operate in wideband or fundamental-only mode.

Figure 3:
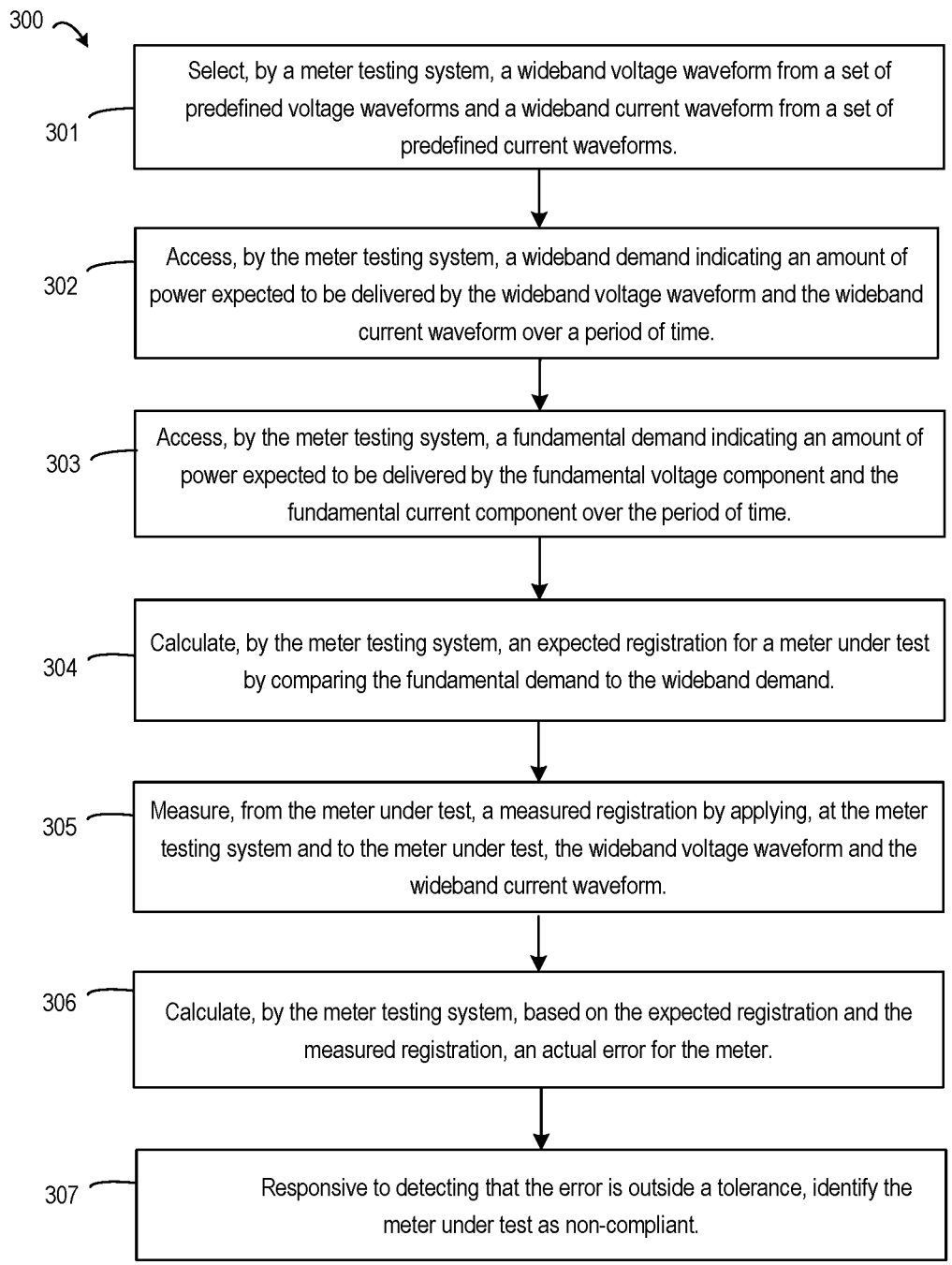
FIG. 3 is a flowchart illustrating an exemplary process for verifying a meter configured in fundamental-only mode within a wideband testing environment.

As explained further with respect to FIG. 3, meter testing system 201 provides a known voltage and a known current to test meter 260, resulting in an output from meter 260 that indicates a power consumption, or registration, at meter 260. Based on expected values, meter testing system 201 can determine whether meter 260 is compliant with a relevant standard.

More specifically, meter testing system 201 includes computing system 210, database 212, and wideband precision power source 213. Computing system 210, an example of which is described further with respect to FIG. 4, can execute meter testing application 211. Meter testing application 211 can calculate parameters such as expected fundamental-only demand, wideband demand, and expected error and store the parameters in database 212.

Wideband precision power source 213 is a precise power source that can generate one or more wideband voltage and current waveforms. Each voltage and current waveform includes a fundamental frequency (e.g., 60 Hz) and one or more harmonics. The generated voltage and current can be controlled independently to apply to the meter under test. Additionally, the amplitude, phase and harmonic content can be adjusted independently.

Because harmonic content is known, for example, as specified by an amplitude and a phase relative to the fundamental frequency, meter testing system 201 can calculate an expected registration and error based on the expected fundamental-only and wideband demands. In some cases, meter testing system 201 can include a known load. The known load can be used instead of a controlled generated current. The known load can have a known resistance and reactance, thereby causing a current to form based on an applied voltage. The reactance of known test loading can be adjusted, by adjusting the amplitude and phase of the test current relative to the test voltage. In this manner, a range of different configurations can be used to test meter 260 to improve test coverage.

In some cases, a power delivery mechanism such as wideband precision power source 213, is at least four times greater than a stability of the device under test. Stability refers to the consistency of the voltages and currents delivered a the source and the consistency of the measurements. For example, a test source accuracy should be greater than 0.05%. By way of comparison, some equipment that is commercially available today is capable of 0.005%.

FIG. 3 is a flowchart illustrating an exemplary process for verifying a meter configured in fundamental-only mode within a wideband testing environment. Process 300 can be executed by computing system 210. In an example, process 300 involves calculating an expected amount of power consumption to be measured by meter 260 based on meter 260 measuring fundamental-only content. Meter 260 outputs a measured power consumption, which facilitates determining whether the meter is within a specification or tolerance.

At block 301, process 300 involves selecting, by a meter testing system, a wideband voltage waveform from a set of predefined voltage waveforms and a wideband current waveform from a set of predefined current waveforms. Each of the wideband voltage waveform and the wideband current waveform can include a fundamental component and one or more harmonic components. For example, a waveform can contain a fundamental at 60 Hz, a third harmonic at 180 Hz, and a fifth harmonic at 300 Hz. Each of the harmonic components can be phase shifted with respect to the fundamental waveform, by the same phase amount or by different phase amounts.

The wideband test waveforms can be created to match a waveform dictated by a standard such as American National Standards Institute (ANSI). In an example, the predefined voltage waveforms include waveforms created from harmonic waveforms as defined in C12.20-2015. ANSI C12.20 compliant meters measure wideband power consumption, therefore reference, or expected output is a power consumption metric that assumes wideband power measurement.

the fundamental frequency, whereas the fifth current harmonic is in phase with the fundamental frequency of the current.

TABLE 1

An exemplary waveform

| Harmonic | V(%) | Phase Ø (deg) | I(%) | Phase θ (deg) |
|---|---|---|---|---|
| 1 (fundamental) | 100.00% | 0 | 100.00% | 0 |
| 3 | 3.80% | 0 | 80.00% | 180 |
| 5 | 2.40% | 180 | 60.00% | 0 |
| 7 | 1.70% | 0 | 40.00% | 180 |
| 9 | 1.50% | 180 | 22.00% | 0 |
| 11 | 1.10% | 0 | 12.00% | 180 |
| 13 | 0.80% | 180 | 5.00% | 0 |
| 15 | 0.60% | 0 | 2.00% | 180 |
| 17 | 0.40% | 180 | 1.00% | 0 |
| 19 | 0.30% | 0 | 0.50% | 180 |

At block 302, process 300 involves accessing, by the meter testing system, a wideband demand indicating an amount of power expected to be delivered by the wideband voltage waveform and the wideband current waveform over a period of time. Accessing a wideband demand can include reading a predetermined wideband demand from database 212 or from another source. Wideband demand is an expected power consumption or energy over a specific time interval of an ideal meter that measures energy contributions from both fundamental and harmonic waveforms. Energy can be active (resistive) or reactive.

Table 2 illustrates an expected registration calculation for a meter that is provided a wideband voltage waveform and a known wideband waveform. The information in Table 2 facilitates wideband demand calculations.

TABLE 2

Expected Registration Calculation for An Exemplary Wideband Waveform

| | Voltage | | | Current | | | |
|---|---|---|---|---|---|---|---|
| Harmonic | V(%) | $V^2$ | Phase Ø (deg) | I(%) | $I^2$ | Phase θ (deg) | W, Var, Va Demand |
| 1 | 100.00% | 1 | 0 | 100.00% | 1 | 0 | 100.000% |
| 3 | 3.80% | 0.001444 | 0 | 80.00% | 0.64 | 180 | −3.040% |
| 5 | 2.40% | 0.000576 | 180 | 60.00% | 0.36 | 0 | −1.440% |
| 7 | 1.70% | 0.000289 | 0 | 40.00% | 0.16 | 180 | −0.680% |
| 9 | 1.50% | 0.000225 | 180 | 22.00% | 0.0484 | 0 | −0.330% |
| 11 | 1.10% | 0.000121 | 0 | 12.00% | 0.0144 | 180 | −0.132% |
| 13 | 0.80% | 0.000064 | 180 | 5.00% | 0.0025 | 0 | −0.040% |
| 15 | 0.60% | 0.000036 | 0 | 2.00% | 0.0004 | 180 | −0.012% |
| 17 | 0.40% | 0.000016 | 180 | 1.00% | 0.0001 | 0 | −0.004% |
| 19 | 0.30% | 0.000009 | 0 | 0.50% | 0.000025 | 180 | −0.0015% |
| | Sum | 1.002719 | | Sum | 2.2253 | | Total demand 94.32% |
| Amplitude of Waveform (RMS) | RMS = 100.14% | | | RMS = 149.17% | | | Expected Error 106.02% |

Table 1 shows parameters of the fundamental and harmonic components of an exemplary waveform. Table 1 shows, from left to right, a harmonic number (where the first harmonic is the fundamental frequency), voltage, voltage phase, current, and current phase. As can be seen in table 1, the waveform includes a fundamental (first harmonic) and nine total harmonics-odd numbers from three to 19.

Each harmonic component includes a phase Ø that is relative to the fundamental frequency. As depicted, the fifth voltage harmonic is 180 degrees out-of-phase with respect to As can be seen, Table 2 illustrates, for each component of the voltage and the current waveforms, an amplitude of each harmonic, a square of the amplitude, and a phase. The phase is relative to the fundamental component. The last column indicates a demand value, or power contribution, from each respective waveform. As depicted, the amplitude of each harmonic is normalized relative to the fundamental (which is 100%).

In some cases, meter testing application 211 can use a model of an ideal meter to determine a wideband demand.

In other cases, meter testing application 211 can measure a registration at a reference meter and use the registration as the expected demand.

Fundamental demand and wideband demand can differ. For example, a power contribution from a fundamental waveform only can result in a higher or a lower power being detected than actually delivered due to harmonic components that either reduce or add to the power. Different calculation methods can be used to determine a demand. Examples of different modes include the Watt-Hour method, the VA vectoral method, the Var-hour integral method, or other methods defined in the ANSI C12.24 standard. Additionally, meter testing application 211 can calculate a wideband demand based on a different energy method than meter 260 uses to calculate its registration.

Wideband demand can be computed by adding the individual contributions of the fundamental and harmonic components of the voltage and current waveforms. For example, using the watt-hour method, the total power contribution is the sum of all the individual power contributions, e.g., from the fundamental and the harmonics. For example, for a given harmonic, the power demand contribution $P_i$ is:

$$P_i = V_i * \cos(\emptyset_i) * I_i * \cos(\theta_i),$$

where $V_i$ is the respective voltage, $\emptyset_i$ the phase angle of the respective voltage, $I_i$ the respective current, and $\theta_i$ the phase of the respective current.

Therefore, considering the third harmonic as an example, (3.80%)*cos (0 degrees)*(80.00%)*cos (180 degrees)=−3.040%. Therefore, the third harmonic causes a −3.040% reduction in the expected demand value for a fundamental component.

The total demand contribution P can be calculated by summing the individual power contributions:

$$P = \sum_{i=1}^{n} P_i$$

Summing all the demand values results in a total demand of 94.32% relative to the fundamental only component. The expected error of meter 260 is 106.02% (1/94.32%). Therefore, when provided this waveform, meter 260 is expected to register 106.02% of the power from the entire waveform.

In contrast, using the Volt-Amp (VA) vectoral method, meter testing application 211 separately calculates, for each harmonic, a VA (reactive power) contribution and a power contribution. For example, meter testing application 211 calculates an expected reactive power contribution of the fundamental component and an additional expected reactive power contribution for the harmonic component. Meter testing application 211 combines the expected reactive power contribution and the additional expected reactive power contribution and derives the wideband demand from the combination of the power contributions and the reactive power contributions. For example, the combination of power and reactive power contributions can be combined to calculate a total demand by:

$$P = \sqrt{\sum_{i=1}^{n} VA_i + \sum_{i=1}^{n} P_i},$$

where $P_i$ is a power demand contribution for a given harmonic, and $VA_i$ is a volt-ampere contribution for a given harmonic.

Additionally, in another example, meter testing application 211 can use the Var-hour integral method. This method involves calculating var-hours by:

$$P = \sqrt{VAh^2 + Wh^2}, \text{ where}$$

VAh refers to VA-hours and Wh refers to Watt-hours.

At block 303, process 300 involves accessing, by the meter testing system, a fundamental demand indicating an amount of power expected to be delivered by the fundamental voltage component and the fundamental current component over the period of time. The fundamental-only demand is a power measurement expected for a meter that measures fundamental-only content (regardless of the waveform provided to the meter). Continuing the example discussed with respect to Table 2 above, meter testing system 201 calculates the demand of the fundamental component as 100%.

At block 304, process 300 involves calculating, by the meter testing system, an expected registration for a meter under test by comparing the fundamental demand to the wideband demand. An expected registration is defined as an expected difference between what a meter under test would measure (e.g., fundamental power only) and the wideband energy delivered to the meter for testing. As explained further, the actual registration can differ from the expected registration due to meter imprecision or errors.

An expected registration can be calculated as follows:

$$\text{Expected Registration}(\%) = \frac{\text{Fundamental Only Demand}}{\text{Wideband Demand}} * 100\%.$$

Further, an expected error can be calculated as follows:

$$\text{Expected Error}(\%) = \left(\frac{\text{Fundamental Only Demand}}{\text{Wideband Demand}} - 1\right) * 100\%$$

Table 3, which is based on Table 2, illustrates example error calculations for an ANSI C12.20 5.5.6.3 pulsed waveform. As can be seen, the expected registration can be above, equal to, or below 100%.

In some cases, meter testing application 211 considers variations in voltage, current, or phase in wideband precision power source 213. For example, wideband precision power source 213 and/or a testing standard can have certain tolerances, which can be accounted for in the expected demand.

Therefore, at block 304, process 300 can further involve determining a maximum voltage offset, a maximum current offset, and a maximum phase offset for the waveform, and updating the error based on the offsets. As can be seen in Table 3 below, the fundamental frequency and each harmonic can have an error due to voltage, current, or phase. Each component modifies the demand based on these maximum errors. Accordingly, as shown, the total demand for the waveform is modified to 94.3205949%, which differs slightly from the result above in Table 3. Meter testing application 211 can consider this updated total demand when determining if the meter is out-of-specification.

TABLE 3

Updated Demand Calculations Based on Errors in Source

| Harmonic | Demand | Maximum Voltage Offset | Maximum Current Offset | Maximum Phase Offset | Modified Demand based on MAX error of the Precision Source |
|---|---|---|---|---|---|
| 1 | 100% | 0.00005 | 0.00005 | 0.005 | 100.0001% |
| 3 | −3.04% | 0.0000019 | 0.00004 | 0.005 | −3.04000303% |
| 5 | −1.44% | 0.0000012 | 0.00003 | 0.005 | −1.44000143% |
| 7 | −0.68% | 8.5E−07 | 0.00002 | 0.005 | −0.68000068% |
| 9 | −0.33% | 7.5E−07 | 0.000011 | 0.005 | −0.33000033% |
| 11 | −0.132% | 5.5E−07 | 0.000006 | 0.005 | −0.13200013% |
| 13 | −0.04% | 0.0000004 | 2.5E−06 | 0.005 | −0.04000004% |
| 15 | −0.012% | 0.0000003 | 0.000001 | 0.005 | −0.01200001% |
| 17 | −0.004% | 0.0000002 | 5E−07 | 0.005 | −0.004% |
| 19 | −0.0015% | 1.5E−07 | 2.5E−07 | 2 | −0.00149909% |
| | | | | Total Demand | 94.3205949% |

At block 305, process 300 involves measuring, from the meter under test, a measured registration by applying, at the meter testing system and to the meter under test, the wideband voltage component and the wideband current waveform. Meter 260 outputs a measurement, which can be in the form of a pulse, that indicates measured power consumption over a period of time. A pulse output can represent a "Quanta" or a unit of energy consumed. This value can be referred to as "KH" of the meter and is expressed (for Watt hours) as Watt-Hours/Pulse.

An actual registration is calculated as follows:

$$\text{Actual Registration}(\%) = \frac{\text{Measured Registration}}{\text{Expected Registration}} * 100\%,$$

where measured registration is the actual power measurement output by the meter under test when provided the wideband waveform.

At block 306, process 300 involves calculating, by the meter testing system, based on the expected registration and the measured registration, an actual error for the meter. In an example, an actual error can be calculated as follows:

$$\text{Actual Error}(\%) = \left(\frac{\text{Measured Registration}}{\text{Expected Registration}} - 1\right) * 100\%$$

At block 307, process 300 involves responsive to detecting that the error is outside a tolerance, identifying the meter under test as non-compliant. If the error is within a tolerance, then the meter can be identified as suitable for deployment.

Wideband Waveforms for Testing

Over a sufficiently large set of test waveforms, meter testing system 201 can ensure that meter 260 is validated according to a standard. Different test waveforms and different power measurement methods can be used. Table 4 shows expected registrations for different combinations of energy modes used for demand calculation and/or different meter calculations. To create additional test waveforms, a time-shift method can be used. For example, a harmonic can be shifted by n*angle, where n is the respective harmonic order.

TABLE 4

Power-factor measurements of harmonic signals.

| Meter Energy Mode | Reference Energy Mode | Fundamental Phase* | Expected Registration |
|---|---|---|---|
| Watt Hour | Watt Hour | 0, 180 | 106.021% |
| Watt Hour | Watt Hour | 60, 120, 240, 300 | 95.724% |
| Varhr Integral Method | Varhr Integral Method | 90, 270 | 106.021% |
| Varhr Integral Method | Varhr Integral Method | 30, 150, 210, 330 | 95.724% |
| VA Vectoral | VA Integral | 0, 180 | 106.021% |
| VA Vectoral | VA Integral | 60, 120, 240, 300 | 98.733% |
| VA Vectoral | VA Integral | 30, 150, 210, 330 | 99.042% |

Table 5 illustrates a wideband demand calculation for an exemplary testing waveform. As can be seen, the total demand of the wideband waveform is 104.47%, that is, the harmonic components are increasing the available power. The expected error on the part of a meter is 95.72%.

TABLE 5

Demand Calculation for an Exemplary Waveform

| | Voltage | | | Current | | | |
|---|---|---|---|---|---|---|---|
| Harmonic | V(%) | $V^2$ | Phase θ (deg) | I(%) | $I^2$ | Phase θ (deg) | W, Var Demand |
| 1 | 100.00% | 1 | 0 | 100.00% | 1 | 60 | 100.000% |
| 3 | 3.80% | 0.001444 | 0 | 80.00% | 0.64 | 0 | 6.080% |
| 5 | 2.40% | 0.000576 | 180 | 60.00% | 0.36 | 300 | −1.440% |
| 7 | 1.70% | 0.000289 | 0 | 40.00% | 0.16 | 240 | −0.680% |
| 9 | 1.50% | 0.000225 | 180 | 22.00% | 0.0484 | 180 | 0.660% |

TABLE 5-continued

Demand Calculation for an Exemplary Waveform

| Harmonic | Voltage | | | Current | | | W, Var Demand |
|---|---|---|---|---|---|---|---|
| | V(%) | $V^2$ | Phase ∅ (deg) | I(%) | $I^2$ | Phase θ (deg) | |
| 11 | 1.10% | 0.000121 | 0 | 12.00% | 0.0144 | 120 | −0.132% |
| 13 | 0.80% | 0.000064 | 180 | 5.00% | 0.0025 | 60 | −0.040% |
| 15 | 0.60% | 0.000036 | 0 | 2.00% | 0.0004 | 0 | 0.024% |
| 17 | 0.40% | 0.000016 | 180 | 1.00% | 0.0001 | 300 | −0.004% |
| 19 | 0.30% | 0.000009 | 0 | 0.50% | 0.000025 | 240 | −0.0015% |
| Amplitude of Waveform (RMS) | Sum RMS = 100.14% | 1.002719 | | Sum RMS = 149.17% | 2.2253 | | Total demand 104.47%/ Expected Error 95.72% |

Table 6 illustrates a wideband demand calculation for an exemplary testing waveform. As can be seen, the total demand of the wideband waveform is 100.80%, that is, the harmonic components are increasing the available power. The expected error on the part of a meter is 99.21%.

TABLE 6

Demand Calculation for an Additional Exemplary Waveform

| Harmonic | Voltage | | | Current | | | W, Var Demand |
|---|---|---|---|---|---|---|---|
| | V(%) | $V^2$ | Phase ∅ (deg) | I(%) | $I^2$ | Phase θ (deg) | |
| 1 | 100.00% | 1 | 0 | 100.00% | 1 | 0 | 100.000% |
| 3 | 3.80% | 0.001444 | 0 | 80.00% | 0.64 | 180 | 1.013% |
| 5 | 2.40% | 0.000576 | 180 | 60.00% | 0.36 | 0 | −0.288% |
| 7 | 1.70% | 0.000289 | 0 | 40.00% | 0.16 | 180 | 0.097% |
| 9 | 1.50% | 0.000225 | 180 | 22.00% | 0.0484 | 0 | −0.037% |
| 11 | 1.10% | 0.000121 | 0 | 12.00% | 0.0144 | 180 | 0.012% |
| 13 | 0.80% | 0.000064 | 180 | 5.00% | 0.0025 | 0 | −0.003% |
| 15 | 0.60% | 0.000036 | 0 | 2.00% | 0.0004 | 180 | 0.001% |
| 17 | 0.40% | 0.000016 | 180 | 1.00% | 0.0001 | 0 | 0.000% |
| 19 | 0.30% | 0.000009 | 0 | 0.50% | 0.000025 | 180 | 0.000% |
| Amplitude of Waveform (RMS) | Sum RMS = 100.14% | 1.002719 | | Sum RMS = 149.17% | 2.2253 | | Total demand 100.80%/ Expected Error 99.21% |

Exemplary Testing Results

As discussed, meter testing application 211 can test meter 260 with different wideband waveforms. Example testing data is shown below in Table 7.

TABLE 7

Exemplary Testing Results

| Energy Mode (reference) | Energy Mode (Meter under test)) | Measured registration | Expected registration | Error (%) |
|---|---|---|---|---|
| Wh | Wh | 105.95 | 106.021 | −0.068 |
| Wh | Wh | 105.98 | 106.021 | −0.035 |
| Wh | Wh | 95.74 | 95.724 | 0.014 |
| Wh | Wh | 95.75 | 95.724 | 0.021 |
| Wh | Wh | 95.75 | 95.724 | 0.021 |
| Wh | Wh | 95.74 | 95.724 | 0.012 |
| Wh | Wh | 105.99 | 106.021 | −0.033 |
| Wh | Wh | 106.01 | 106.021 | −0.009 |
| Wh | Wh | 95.69 | 95.724 | −0.033 |
| Wh | Wh | 95.75 | 95.724 | 0.025 |
| Wh | Wh | 95.74 | 95.724 | 0.013 |
| Wh | Wh | 95.71 | 95.724 | −0.015 |
| Varh INT | Varh INT | 105.93 | 106.021 | −0.091 |
| Varh INT | Varh INT | 105.96 | 106.021 | −0.043 |
| Varh INT | Varh INT | 95.72 | 95.724 | −0.005 |
| Varh INT | Varh INT | 95.73 | 95.724 | 0.001 |

TABLE 7-continued

Exemplary Testing Results

| Energy Mode (reference) | Energy Mode (Meter under test)) | Measured registration | Expected registration | Error (%) |
|---|---|---|---|---|
| Varh INT | Varh INT | 95.71 | 95.724 | −0.012 |
| Varh INT | Varh INT | 95.72 | 95.724 | −0.007 |
| Varh INT | Varh INT | 105.95 | 106.021 | −0.070 |
| Varh INT | Varh INT | 105.94 | 106.021 | −0.080 |
| Varh INT | Varh INT | 95.69 | 95.724 | −0.037 |
| Varh INT | Varh INT | 95.70 | 95.724 | −0.029 |
| Varh INT | Varh INT | 95.66 | 95.724 | −0.068 |
| Varh INT | Varh INT | 95.42 | 95.724 | −0.107 |
| VA INT | VAh Vector | 105.98 | 106.021 | −0.044 |
| VA INT | VAh Vector | 105.99 | 106.021 | −0.033 |
| VA INT | VAh Vector | 98.67 | 98.733 | −0.061 |
| VA INT | VAh Vector | 98.66 | 98.733 | −0.076 |
| VA INT | VAh Vector | 98.67 | 98.733 | −0.043 |
| VA INT | VAh Vector | 98.60 | 98.733 | −0.132 |
| VA INT | VAh Vector | 106.01 | 106.021 | −0.007 |
| VA INT | VAh Vector | 106.01 | 106.021 | −0.013 |
| VA INT | VAh Vector | 98.69 | 98.733 | −0.044 |

Exemplary Computing Devices

Figure 4:
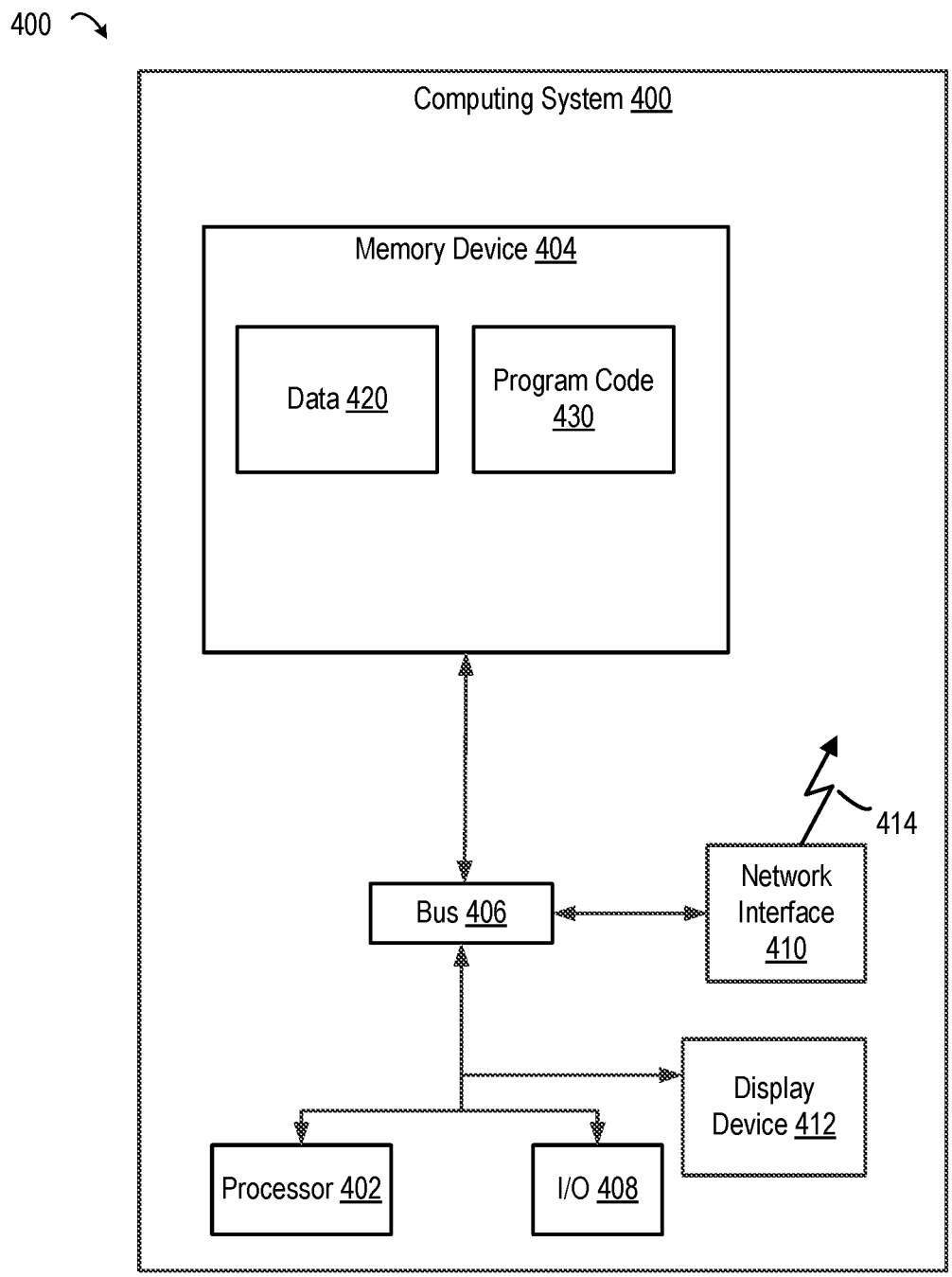
FIG. 4 illustrates an exemplary meter testing device.

FIG. 4 illustrates an exemplary computing device. Any suitable computing system may be used for performing the operations described herein, such as implementing computing system 210. The depicted example of a computing device 400 includes a processor 402 communicatively coupled to one or more memory devices 404. The processor 402 executes computer-executable program code 430 stored in a memory device 404, accesses data 420 stored in the memory device 404, or both. Examples of the processor 402 include a microprocessor, an application-specific integrated circuit ("ASIC"), a field-programmable gate array ("FPGA"), or any other suitable processing device. The processor 402 can include any number of processing devices or cores, including a single processing device. The functionality of the computing device may be implemented in hardware, software, firmware, or a combination thereof.

The memory device 404 includes any suitable non-transitory computer-readable medium for storing data, program code, or both. A computer-readable medium can include any electronic, optical, magnetic, or other storage device capable of providing a processor with computer-readable instructions or other program code. Non-limiting examples of a computer-readable medium include a flash memory, a ROM, a RAM, an ASIC, or any other medium from which a processing device can read instructions. The instructions may include processor-specific instructions generated by a compiler or an interpreter from code written in any suitable computer-programming language, including, for example, C, C++, C#, Visual Basic, Java, or scripting language.

The computing device 400 may also include a number of external or internal devices, such as input or output devices. For example, the computing device 400 is shown with one or more input/output ("I/O") interfaces 408. An I/O interface 408 can receive input from input devices or provide output to output devices. One or more busses 406 are also included in the computing device 400. The bus 406 communicatively couples one or more components of a respective one of the computing device 400.

The computing device 400 executes program code 430 that configures the processor 402 to perform one or more of the operations described herein. For example, the program code 430 causes the processor to perform the operations described in FIG. 3.

The computing device 400 also includes a network interface device 410. The network interface device 410 includes any device or group of devices suitable for establishing a wired or wireless data connection to one or more data networks. The network interface device 410 may be a wireless device and have an antenna 414. The computing device 400 can communicate with one or more other computing devices implementing the computing device or other functionality via a data network using the network interface device 410.

The computing device 400 can also include a display device 412. Display device 412 can be a LCD, LED, touch-screen or other device operable to display information about the computing device 400. For example, information could include an operational status of the computing device, network status, etc.

General Considerations

While the present subject matter has been described in detail with respect to specific aspects thereof, it will be appreciated that those skilled in the art, upon attaining an understanding of the foregoing, may readily produce alterations to, variations of, and equivalents to such aspects. Accordingly, it should be understood that the present disclosure has been presented for purposes of example rather than limitation and does not preclude inclusion of such modifications, variations, and/or additions to the present subject matter as would be readily apparent to one of ordinary skill in the art.

What is claimed is:

1. A method of validating fundamental-only power measurements, the method comprising:
    selecting, by a meter testing system, a wideband voltage waveform from a plurality of predefined voltage waveforms, and a wideband current waveform from a plurality of predefined current waveforms, the wideband voltage waveform comprising a fundamental voltage component and a harmonic voltage component and the wideband current waveform comprising a fundamental current component and a harmonic current component;
    accessing, by the meter testing system, a wideband demand indicating an amount of power expected to be delivered by the wideband voltage waveform and the wideband current waveform over a period of time;
    accessing, by the meter testing system, a fundamental demand indicating an amount of power expected to be delivered by the fundamental voltage component and the fundamental current component over the period of time;
    calculating, by the meter testing system, an expected registration for a meter under test by comparing the fundamental demand to the wideband demand;
    measuring, from the meter under test, a measured registration by applying, at the meter testing system and to the meter under test, the wideband voltage waveform and the wideband current waveform, wherein the meter under test is configured to measure power consumption from the fundamental voltage component and the fundamental current component only;
    calculating, by the meter testing system, based on the expected registration and the measured registration, an error for the meter; and
    when the error is outside a tolerance, identifying the meter under test as non-compliant.

2. The method of claim 1, wherein accessing the wideband demand comprises:

calculating by the meter testing system, an expected power consumption contribution of the fundamental voltage component and the fundamental current component;

calculating by the meter testing system, an additional expected power consumption contribution for the harmonic voltage component and the harmonic current component;

combining by the meter testing system, the expected power consumption contribution and the additional expected power consumption contribution into a power contribution; and deriving the wideband demand from the combination of the expected power consumption contribution and the additional expected power consumption contribution.

3. The method of claim 2, wherein accessing the wideband demand further comprises:

calculating, by the meter testing system, an expected reactive power contribution of the fundamental voltage component and the fundamental current component;

calculating, by the meter testing system, an additional expected reactive power contribution for the harmonic voltage component and the harmonic current component;

combining, by the meter testing system, the expected reactive power contribution and the additional expected reactive power contribution into a reactive power contribution; and deriving the wideband demand from the combination of the power contribution and the reactive power contribution.

4. The method of claim 1, wherein accessing the fundamental demand comprises calculating a power contribution of the fundamental voltage component and the fundamental current component.

5. The method of claim 1, further comprising determining a maximum voltage offset, a maximum current offset, and a maximum phase offset for the wideband voltage waveform, and updating the error based on the maximum voltage offset, the maximum current offset, and the maximum phase offset.

6. The method of claim 1, wherein the measured registration is indicated by a number of pulses per unit time.

7. The method of claim 1, wherein accessing the wideband demand comprises applying the wideband voltage waveform and a known load to a reference meter for the period of time and obtaining a measurement from the reference meter.

8. A electric meter testing system comprising:
a precision voltage source;
a precision current source; and
a computing device comprising a processor and a memory, the computing device configured to:
select a wideband voltage waveform from a plurality of predefined voltage waveforms, the wideband voltage waveform comprising a fundamental voltage component and a harmonic voltage component;
select a wideband current waveform from a plurality of predefined current waveforms, the wideband current waveform comprising a fundamental current component and a harmonic current component;
access, from the memory, a wideband demand indicating an amount of power expected to be delivered by the wideband voltage waveform and the wideband current waveform over a period of time;
access, from the memory, a fundamental demand indicating an amount of power expected to be delivered by the fundamental voltage component and the fundamental current component over the period of time;
calculate, by the processor, an expected registration for a meter under test by comparing the fundamental demand to the wideband demand;
measure a measured registration by causing the precision voltage source to apply the wideband voltage waveform to the meter under test and the precision current source to apply the wideband current waveform to the meter under test, wherein the meter under test is configured to measure power consumption from the fundamental voltage component and the fundamental current component only;
calculate, by the processor and based on the expected registration and the measured registration, an error for the meter; and
when the error is outside a tolerance, identify the meter under test as non-compliant.

9. The electric meter testing system of claim 8, wherein accessing the wideband demand comprises:

calculating an expected power consumption contribution of the fundamental voltage component and the fundamental current component;

calculating an additional expected power consumption contribution for the harmonic voltage component and the harmonic current component;

combining the expected power consumption contribution and the additional expected power consumption contribution into a power contribution; and deriving the wideband demand from the combination of the expected power consumption contribution and the additional expected power consumption contribution.

10. The electric meter testing system of claim 9, wherein accessing the wideband demand further comprises:

calculating an expected reactive power contribution of the fundamental voltage component and the fundamental current component;

calculating an additional expected reactive power contribution for the harmonic voltage component and the harmonic current component;

combining the expected reactive power contribution and the additional expected reactive power contribution into a reactive power contribution; and deriving the wideband demand from the combination of the power contribution and the reactive power contribution.

11. The electric meter testing system of claim 8, wherein the computing device is further configured to determine a maximum voltage offset, a maximum current offset, and a maximum phase offset for the wideband voltage waveform, and update the error based on the maximum voltage offset, the maximum current offset, and the maximum phase offset.

12. The electric meter testing system of claim 8, wherein accessing the wideband demand comprises applying the wideband voltage waveform and a known load to a reference meter for the period of time and obtaining a measurement from the reference meter.

13. The electric meter testing system of claim 8, wherein accessing the fundamental demand comprises calculating a power contribution of the fundamental voltage component and the fundamental current component.

14. The electric meter testing system of claim 8, wherein the computing device is further configured to determine a maximum voltage offset, a maximum current offset, and a maximum phase offset for the wideband voltage waveform, and update the error based on the maximum voltage offset, the maximum current offset, and the maximum phase offset.

15. A meter testing environment comprising:
an electric meter configured to measure a power consumption from a fundamental component only;
a precision voltage source;
a precision current source; and
a computing device comprising a processor and a memory, the computing device configured to:
  select a wideband voltage waveform from a plurality of predefined voltage waveforms, the wideband voltage waveform comprising a fundamental voltage component and a harmonic voltage component;
  select a wideband current waveform from a plurality of predefined current waveforms, the wideband current waveform comprising a fundamental current component and a harmonic current component;
  access, from the memory, a wideband demand indicating an amount of power expected to be delivered by the wideband voltage waveform and the wideband current waveform over a period of time;
  access, from the memory, a fundamental demand indicating an amount of power expected to be delivered by the fundamental voltage component and the fundamental current component over the period of time;
  calculate, by the processor, an expected registration for a meter under test by comparing the fundamental demand to the wideband demand;
  measure, at the electric meter, a measured registration by applying the wideband voltage waveform and the wideband current waveform to the meter;
  calculate, by the processor and based on the expected registration and the measured registration, an error for the meter; and
  when the error is outside a tolerance, identifying the meter under test as non-compliant.

16. The meter testing environment of claim 15, further comprising a reference meter, wherein accessing the wideband demand comprises applying the wideband voltage waveform and a known load to the reference meter for the period of time and obtaining a measurement from the reference meter.

17. The meter testing environment of claim 15, wherein accessing the wideband demand comprises:
  calculating an expected power consumption contribution of the fundamental component;
  calculating an additional expected power consumption contribution for the voltage harmonic component and current harmonic component;
  combining the expected power consumption contribution and the additional expected power consumption contribution into a power contribution; and
  deriving the wideband demand from the combination of the expected power consumption contribution and the additional expected power consumption contribution.

18. The meter testing environment of claim 17, wherein accessing the wideband demand further comprises:
  calculating an expected reactive power contribution of the fundamental component;
  calculating an additional expected reactive power contribution for the harmonic voltage component and the harmonic current component;
  combining the expected reactive power contribution and the additional expected reactive power contribution into a reactive power contribution; and
  deriving the wideband demand from the combination of the power contribution and the reactive power contribution.

19. The meter testing environment of claim 15, wherein accessing the fundamental demand comprises calculating a power contribution of the fundamental component.

20. The meter testing environment of claim 15, wherein the computing device is further configured to determine a maximum voltage offset, a maximum current offset, and a maximum phase offset for the wideband voltage waveform, and update the error based on the maximum voltage offset, the maximum current offset, and the maximum phase offset.

* * * * *